United States Patent
Sharon et al.

(10) Patent No.: US 7,984,360 B2
(45) Date of Patent: Jul. 19, 2011

(54) AVOIDING ERRORS IN A FLASH MEMORY BY USING SUBSTITUTION TRANSFORMATIONS

(75) Inventors: Eran Sharon, Rishon Le Zion (IL); Simon Litsyn, Givat Shmuel (IL); Idan Alrod, Tel Aviv (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 938 days.

(21) Appl. No.: 11/876,789

(22) Filed: Oct. 23, 2007

(65) Prior Publication Data

US 2008/0158948 A1    Jul. 3, 2008

Related U.S. Application Data

(60) Provisional application No. 60/882,933, filed on Dec. 31, 2006.

(51) Int. Cl.
*G11C 29/00*    (2006.01)
(52) U.S. Cl. .................. 714/766; 365/185.2; 365/185.3
(58) Field of Classification Search .................. 714/766; 365/185.2
See application file for complete search history.

(56) References Cited

U.S. PATENT DOCUMENTS

| 5,434,825 | A | 7/1995 | Harari |
| 6,469,931 | B1 | 10/2002 | Ban |
| 6,684,289 | B1 | 1/2004 | Gonzalez et al. |
| 7,023,739 | B2* | 4/2006 | Chen et al. ............... 365/185.28 |
| 2004/0143699 | A1 | 7/2004 | Norman |
| 2005/0213393 | A1 | 9/2005 | Lasser |
| 2008/0055984 | A1* | 3/2008 | Nazarian .................. 365/185.03 |

OTHER PUBLICATIONS

U.S. Appl. No. 11/540,560, filed Oct. 2006, Litsyn.
U.S. Appl. No. 11/797,379, filed May 2007, SanDisk.
U.S. Appl. No. 11/808,906, filed Jun. 2007, San Disk.
U.S. Appl. No. 11/540,560, filed Oct. 2006, San Disk.

* cited by examiner

*Primary Examiner* — Sam Rizk
(74) *Attorney, Agent, or Firm* — Mark M. Friedman

(57) ABSTRACT

To store an input string of M N-tuples of bits, a substitution transformation is selected in accordance with the input string and is applied to the input string to provide a transformed string of M N-tuples of bits. M or more memory cells are programmed to represent the transformed string and preferably also to represent a key of the transformation. Alternatively, the memory selectively programs each of M or more cells to a respective one of $2^N$ states. A mapping that maps the binary numbers in $[0, 2^N-1]$ into respective states is selected in accordance with the input string and is used to program M cells to represent the input string. Preferably, a key of the mapping is stored in the memory in association with the M cells.

34 Claims, 7 Drawing Sheets

AVOIDING ERRORS IN A FLASH MEMORY BY USING SUBSTITUTION TRANSFORMATIONS

This patent application claims the benefit of U.S. Provisional Patent Application No. 60/882,933, filed Dec. 31, 2006

FIELD AND BACKGROUND OF THE INVENTION

The present invention relates to flash memories and, more particularly, to methods of transforming data for more reliable storage in a flash memory.

Flash memory devices have been known for many years. Typically, each cell within a flash memory stores one bit of information. Traditionally, the way to store a bit has been by supporting two states of the cell—one state represents a logical "0" and the other state represents a logical "1". In a flash memory cell the two states are implemented by having a floating gate above the cell's channel (the area connecting the source and drain elements of the cell's transistor), and having two valid states for the amount of charge stored within this floating gate. Typically, one state is with zero charge in the floating gate and is the initial unwritten state of the cell after being erased (commonly defined to represent the "1" state) and another state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. Now it is possible to read the stored bit by checking the threshold voltage of the cell—if the threshold voltage is in the higher state then the bit value is "0" and if the threshold voltage is in the lower state then the bit value is "1". Actually there is no need to accurately read the cell's threshold voltage—all that is needed is to correctly identify in which of the two states the cell is currently located. For that purpose it suffices to make a comparison against a reference voltage value that is in the middle between the two states, and thus to determine if the cell's threshold voltage is below or above this reference value.

FIG. 1A shows graphically how this works. Specifically, FIG. 1A shows the distribution of the threshold voltages of a large population of cells. Because the cells in a flash device are not exactly identical in their characteristics and behavior (due, for example, to small variations in impurity concentrations or to defects in the silicon structure), applying the same programming operation to all the cells does not cause all of the cells to have exactly the same threshold voltage. (Note that, for historical reasons, writing data to a flash memory is commonly referred to as "programming" the flash memory. The terms "writing" and "programming" are used interchangeably herein.) Instead, the threshold voltage is distributed similar to the way shown in FIG. 1A. Cells storing a value of "1" typically have a negative threshold voltage, such that most of the cells have a threshold voltage close to the value shown by the left peak of FIG. 1A, with some smaller numbers of cells having lower or higher threshold voltages. Similarly, cells storing a value of "0" typically have a positive threshold voltage, such that most of the cells have a threshold voltage close to the value shown by the right peak of FIG. 1A, with some smaller numbers of cells having lower or higher threshold voltages.

In recent years a new kind of flash device has appeared on the market, using a technique conventionally called "Multi Level Cells" or MLC for short. (This nomenclature is misleading, because the previous type of flash cells also has more than one level: they have two levels, as described above. Therefore, the two kinds of flash cells are referred to herein as "Single Bit Cells" (SBC) and "Multi-Bit Cells" (MBC).) The improvement brought by the MBC flash is the storing of two bits in each cell. (In principle MBC also includes the storage of more than two bits per cell. In order to simplify the explanations, the two-bit case is emphasized herein. It should however be understood the present invention is equally applicable to flash memory devices that support more than two bits per cell.) In order for a single cell to store two bits of information the cell must be able to be in one of four different states. As the cell's "state" is represented by its threshold voltage, it is clear an MBC cell should support four different valid ranges for its threshold voltage. FIG. 1B shows the threshold voltage distribution for a typical MBC cell. As expected, FIG. 1B has four peaks, each corresponding to one of the states. As for the SBC case, each state is actually a range of threshold voltages and not a single threshold voltage. When reading the cell's contents, all that must be guaranteed is that the range that the cell's threshold voltage is in is correctly identified. For a prior art example of an MBC flash device see U.S. Pat. No. 5,434,825 to Harari.

When encoding two bits in an MBC cell as one of the four states, it is common to have the left-most state in FIG. 1B (typically having a negative threshold voltage) represent the case of both bits having a value of "1". (In the discussion below the following notation is used—the two bits of a cell are called the "lower bit" and the "upper bit". An explicit value of the bits is written in the form ["upper bit" "lower bit"], with the lower bit value on the right. So the case of the lower bit being "0" and the upper bit being "1" is written as "10". One must understand that the selection of this terminology and notation is arbitrary, and other names and encodings are possible). Using this notation, the left-most state represents the case of "11". The other three states are illustrated as assigned in the following order from left to right— "10", "00", "01", One can see an example of an implementation of an MBC NAND flash device using such encoding as described above in U.S. Pat. No. 6,522,580 to Chen, which patent is incorporated by reference for all purposes as if fully set forth herein. See in particular FIG. 8 of the Chen patent. It should be noted though that the present invention does not depend on this assignment of the states, and there are other ordering that can be used. When reading an MBC cells content, the range that the cell's threshold voltage is in must be identified correctly; only in this case this cannot always be achieved by comparing to one reference voltage, and several comparisons may be necessary. For example, in the case illustrated in FIG. 1B, one way to read the lower bit is first to compare the cell's threshold voltage to a reference comparison voltage $V_1$ and then, depending on the outcome of the comparison, to compare the cell's threshold voltage to either a zero reference comparison voltage or a reference comparison voltage $V_2$. Another way to read the lower bit is to compare the cell's threshold voltage unconditionally to both the zero reference voltage and $V_2$. In either case, two comparisons are needed.

MBC devices provide a great advantage of cost—using a similarly sized cell one stores two bits rather than one. However, there are also some drawbacks to using MBC flash—the average read and write times of MBC memories are longer than of SBC memories, resulting in lower performance. Also, the reliability of MBC is lower than SBC. This can easily be understood—the differences between the threshold voltage ranges in MBC are much smaller than in SBC. Thus, a disturbance in the threshold voltage (e.g. leaking of the stored charge causing a threshold voltage drift, interference from operations on neighboring cells, etc.) that may have gone unnoticed in SBC because of the large gap between the two states, might cause an MBC cell to move from one state to another, resulting in an erroneous bit. The end result is a lower quality specification of MBC cells in terms of data retention time or the endurance of the device to many write/erase cycles. Thus there are advantages to using both MBC cells and SBC cells, and the selection can be different depending on the application's requirements.

While the above explanations deal with floating-gate flash memory cells, there are other types of flash memory technologies. For example, in the NROM flash memory technology there is no conductive floating gate but instead there is an insulating layer trapping the electric charge. The present invention is equally applicable to all flash memory types, even though the explanations herein are given in the context of floating-gate technology.

There are several sources of errors in flash memory devices. The present invention is mainly concerned with a specific source of error commonly called "Program Disturb" or "PD" for short. The PD effect causes cells, that are not intended to be written, to unintentionally move from their initial left-most state to some other state. (The explanations herein assume the common practice, also used in FIGS. 1A and 1B, of drawing the threshold voltage axis such that its left direction represents lower values. This is an arbitrary practice and should not be construed to limit the scope of the present invention in any way). Referring to the two-bit-per-cell example of FIG. 1B, cells that are in the leftmost state corresponding to bit values of "11" (or in other words, to the cell's erased state) and that are supposed to remain in such state, are found to be in the next-to-leftmost state of "10", resulting in one bit out of the two bits stored in such cells to be incorrect. In some cases, especially in cells storing more than two bits per cell and having more than four states, PD effects might turn out not only as a move from the leftmost state to its immediately adjacent state, but also as a move from the leftmost state to more distant states, and also as a move from a state that is not the leftmost state to another state to its right (i.e. having a higher threshold voltage). However, the case described first above of moving from the leftmost state to its immediately adjacent neighboring state is the most common, and will be used herein for all examples and explanations without limiting the generality of the methods of the present invention.

By way of background for a discussion of the reason for the PD effect, FIG. 2, which is identical to FIG. 1 of the Chen patent, is a block diagram of a typical prior art flash memory device. A memory cell array 1 including a plurality of memory cells M arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a program operation, and for controlling voltage levels of the bit lines (BL) to promote the programming or to inhibit the programming. Row control circuit 3 is connected to word lines (WL) to select one of the word lines (WL), to apply read voltages, to apply programming voltages combined with the bit line voltage levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage. Typically, in a NAND flash device, the cells controlled by one word line correspond to one or two pages of the device, and the word lines are organized into blocks, with each block typically including a number of word lines that is a moderate power of 2, e.g., $2^5$=32. A page is the smallest unit of a NAND flash device whose cells can be programmed together. A block is the smallest unit of a NAND flash device whose cells can be erased together.

The data stored in the memory cells (M) are read out by column control circuit 2 and are output to external I/O lines via an I/O line and a buffer in data input/output circuit 6. Program data to be stored in the memory cells are input to the buffer in data input/output circuit 6 via the external I/O lines, and are transferred to the column control circuit 2. The external I/O lines are connected to a controller 20.

Command data for controlling the flash memory device are input to a command interface connected to external control lines that are connected with controller 20. The command data inform the flash memory of what operation is requested. The input command is transferred to a state machine 8 that controls column control circuit 2, row control circuit 3, c-source control circuit 4, c-p-well control circuit 5 and data input/output circuit 6. State machine 8 can output a status data of the flash memory such as READY/BUSY or PASS/FAIL.

Controller 20 is connected or connectable with a host system such as a personal computer, a digital camera, a personal digital assistant. It is the host that initiates commands, such as to store or read data to or from memory array 1, and provides or receives such data, respectively. Controller 20 converts such commands into command signals that can be interpreted and executed by command circuits 7. Controller 20 also typically contains buffer memory for the user data being written to or read from memory array 1. A typical memory system includes one integrated circuit chip 21 that includes controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

The reason for the PD effect is easy to understand when reviewing the voltages applied to the cells of a NAND flash device when programming a page. When programming a page of cells, a relatively high voltage is applied to the word line connected to the control gates of the cells of the page. What decides whether a certain cell threshold voltage is increased as a result of this control gate voltage is the voltage applied to the bit line connected to that cell. A cell that is not to be written with data (that is—that is to remain erased, representing an all-one state), has its bit line connected to a relatively high voltage level that minimizes the voltage difference across the cell. A cell that is to be written has its bit line connected to low voltage, causing a large voltage difference across the cell, and resulting in the cell's threshold voltage getting increased, thus moving the cell to the right on the voltage axis of FIG. 1B and causing the cell's state to change.

However, even though cells that are not meant to be written have a lower voltage difference across them than cells that are meant to be written, the cells that are not to be written still have some voltage difference across them. If the page to be written has some cells that are written to high threshold voltages (for example, to the rightmost state), then the voltage difference across non-programmed cells gets higher. This is because all control gates of all cells of the page get the same voltage applied to them, and the higher the threshold voltage to be reached, the higher is that applied voltage. Therefore the need to apply higher control gate (i.e. word line) voltage to some cells results in higher voltage differences at the non-programmed cells. Even though the cells are designed with the goal of not being affected by such anticipated voltage differences, in actual NAND flash devices such voltage differences stress the cells and might result in some of the cells changing their state even though this was neither intended nor desired.

To summarize the above explanation, PD is an effect in which when programming a page of cells, some cells that are intended to remain in the leftmost erased state end up in another state, resulting in bit errors when reading those cells.

PD effects can be empirically and statistically measured, and counter-measures in the form of error correction schemes may be applied to handle them. Flash device manufacturers are aware of this source of potential errors, and they take it into account when recommending to their customers the level of error correction the customers should use. So when a manufacturer of a two-bit-per-cell MBC flash device recommends a 4-bit ECC scheme (meaning that every 512 bytes of user data should be protected against the occurrence of up to four bit errors), he may base this recommendation on a statistical analysis that assumes a random data pattern stored into the device and on the probability that a PD-type error will occur under such circumstances. Obviously, other error sources and types are also taken into account in such calculations.

Unfortunately, typical real-life user data are not random. Measurements on real-life user files show that the various possible states of the cells do not have equal probability to occur. As the leftmost state of the cells is the default value of cells not being written to, this state is the most frequent. This is easy to understand—a section of memory not initialized, or not used within a file, very often corresponds to cells in the erased state.

As a result, in real-life applications the problem of PD errors is more severe than what is expected based on random data patterns statistical calculations. Relatively many cells will be in the erased state that is the most vulnerable state to PD errors, and therefore more PD errors than are predicted by random data distribution models will actually occur.

The present invention deals with reducing the number of errors due to PD by manipulating the user data and controlling the actual sequences of voltage levels or states programmed into the flash memory. By making sure that only a limited fraction of the cells in the flash memory (or in a page of the flash memory) are programmed to the erase state, which is the state most vulnerable to the PD effect, we can minimize the amount of error due to PD.

Even though the present invention is mainly concerned with reducing PD errors, it is also applicable for reducing the effect of other undesirable phenomena in the flash memory. For example, another error source in the flash memory is leakage of the stored charge from a cell's floating gate, causing a threshold voltage drift. Similarly to PD errors, this error source is also influenced by the user data programmed into the flash memory over time. The reason for this is that the amount of charge leakage depends on the quality of the insulation layer between the floating gate and the conductive channel of the cell's transistor. However the quality of the insulation layer changes with time. The more charge transferred through the insulation layer by applying high stress in the form of high voltage levels differences across the insulation layer, the weaker the insulation layer becomes. As a result, a cell that has sustained many programming and erase (P/E) cycles exhibits a higher error rate than a cell that has sustained few P/E cycles. Moreover, if we compare two cells that have sustained the same number of P/E cycles, but on the average one of the cells has been programmed to higher voltage levels than the other cell, then the cell that has been programmed to higher voltage levels is expected to exhibit a higher error rate than the other cell due to the higher stress applied to the insulation layer of the cell that has been programmed to higher voltage levels. This means that the error rates of a flash device due to P/E cycles also depend on the user data that have been programmed to the flash device. If the user data are statistically distributed in such a way that higher voltage levels are frequently programmed, then the flash memory device will suffer from higher error rates and become less reliable.

Therefore, it is desirable to provide a flash memory device that is more reliable than prior art flash memory devices in the sense of being less vulnerable to phenomena such as PD, especially when used in real-life scenarios where user data are not random and the actual voltage levels programmed into the flash memory are not uniformly distributed over all possible voltage levels.

DEFINITIONS

We refer to a cell error as a cell being read as being in a state other than the state to which the cell was programmed. Obviously, cell errors result in errors in the bits read from the flash. Let us assume that each cell in the flash can be programmed to L different voltage levels or states. Normally, this means that each cell can store up to $N=\log_2 L$ bits; but see also U.S. Pat. No. 6,469,931 to Ban and U.S. patent application Ser. No. 11/540,560 to Litsyn et al. in which this relationship does not strictly hold. Note that this number N of bits programmed into the cell is not necessarily the same as the number of information bits per cell: if, as normally is the case, error correction encoding is applied to the input data, the number of information bits per cell is NR, where R is the ECC rate. A distribution of states over a set of cells in a flash memory device is a sequence of L numbers. Each number corresponds to one possible cell state. This number is equal to the number of cells in the set that are programmed to this state. We say that such states distribution is "good" if it meets certain criteria. The criteria for a good distribution depend on our knowledge of the various physical phenomena in the flash memory that are responsible for data dependent errors and of the statistics of the data generated by the user application. For example, one possible definition of a good states distribution with respect to the PD effect is a distribution in which the fraction of cells programmed to the erase state is minimized, or is smaller than some threshold. A more "sophisticated" definition of a good states distribution would require that both low and high voltage level states be programmed less frequently. This would reduce the overall effect of various undesirable phenomena such as PD and such as increased charge leakage due to faster cell insulation layer weakening.

SUMMARY OF THE INVENTION

As noted above, if the user data are statistically distributed in such a way that higher voltage levels are frequently programmed, then the flash memory device will suffer from higher error rates and become less reliable. By manipulating the user data, we can control the distribution of states over the programmed cells. This can be used for reducing the effect of various undesirable phenomena in the flash device such as PD and such as increased charge leakage due to faster cell insulation layer weakening. For example, by limiting the fraction of cells that are programmed to low voltage levels we can reduce the number of cells that suffer from PD and as a result reduce the overall cell error rate and increase the reliability of the flash memory device. Alternatively, by limiting the fraction of cells that are programmed to high voltage levels, we can increase the effective number of P/E cycles that the flash memory device can endure because we slow down the weakening of the cells' insulation layers. Moreover, when high voltage levels are less frequently programmed, the overall stress applied to the flash cells is smaller and has shorter duration and this reduces the effect of various undesirable phenomena in the flash memory such as PD. Hence by controlling the distribution of programmed states in the flash cells, such that very low and very high states are less frequently programmed, we can increase the reliability, P/E cycle endurance and data retention time of the flash device.

Therefore, according to the present invention there is provided a method of storing an input string of M N-tuples of bits, wherein N>1, the method including the steps of: (a) selecting, in accordance with the input string, a substitution transformation to apply to the input string; (b) applying the selected substitution transformation to the input string, thereby providing a transformed string of M N-tuples of bits; and (c) programming at least M cells of a memory to represent the transformed string.

Furthermore, according to the present invention there is provided a method of storing an input string of M N-tuples of bits, wherein N>1, the method including the steps of: (a) providing a memory that is operative to selectively program each of at least M cells to a respective one of $2^N$ states of the each cell; (b) selecting, in accordance with the input string, a mapping that maps each binary number from 0 through $2^N-1$ into a respective one of the states; and (c) programming M the cells to represent the input string in accordance with the selected mapping.

Furthermore, according to the present invention there is provided a memory including: (a) at least M nonvolatile memory cells; and (b) circuitry for storing an input string of M N-tuples of bits in the nonvolatile memory cells, wherein N>1, by steps including: (i) selecting, in accordance with the input string, a substitution transformation to apply to the input string, (ii) applying the selected substitution transformation to the input string, thereby providing a transformed string of M N-tuples of bits, and (iii) programming at least M of the cells to represent the transformed string.

Furthermore, according to the present invention there is provided a memory device including: (a) a memory including at least M nonvolatile memory cells; and (b) a controller for storing an input string of M N-tuples of bits in the memory, wherein N>1, by steps including: (i) selecting, in accordance with the input string, a substitution transformation to apply to the input string, (ii) applying the selected substitution transformation to the input string, thereby providing a transformed string of M N-tuples of bits, and (iii) instructing the memory to program at least M of the cells to represent the transformed string.

Furthermore, according to the present invention there is provided a system including: (a) a first nonvolatile memory that includes at least M nonvolatile memory cells; and (b) a host, of the first nonvolatile memory, that includes: (i) a host memory for storing an input string of M N-tuples of bits, wherein N>1, (ii) a second nonvolatile memory for storing a driver for the first nonvolatile memory, the driver including code for: (A) selecting, in accordance with the input string, a substitution transformation to apply to the input string, and (B) applying the selected substitution transformation to the input string, thereby providing a transformed string of M N-tuples to be stored in the first nonvolatile memory by programming at least M of the cells to represent the transformed string, and (C) storing the transformed string in the first nonvolatile memory, and (iii) a processor for executing the code of the driver.

Furthermore, according to the present invention there is provided a computer-readable storage medium having computer-readable code embedded thereon, the computer-readable code being driver code for a memory device that includes at least M memory cells, the computer-readable code including: (a) program code for selecting, in accordance with an input string of M N-tuples of bits, wherein N>1, a substitution transformation to apply to the input string; and (b) program code for applying the selected transformation to the input string, thereby providing a transformed string of M N-tuples to be stored in the memory device by programming at least M of the memory cells to represent the transformed string.

Furthermore, according to the present invention there is provided a memory including: (a) at least M nonvolatile memory cells; and (b) circuitry for storing an input string of M N-tuples of bits in the nonvolatile cells, wherein N>1, by steps including: (i) selectively programming each cell to represent each binary number from 0 through $2^N-1$ as a respective one of $2^N$ states of the each cell, (ii) selecting, in accordance with the input string, a mapping that maps the binary numbers into the respective states thereof, and (iii) programming M of the cells to represent the input string in accordance with the selected mapping.

Furthermore, according to the present invention there is provided a memory device including: (a) a memory including: (i) at least M nonvolatile memory cells, and (ii) circuitry for selectively programming each cell to represent each binary number from 0 through $2^N-1$ as a respective one of $2^N$ states of the each cell, and (b) a controller for storing an input string of M N-tuples of bits in the memory, wherein N>1, by steps including: (i) selecting, in accordance with the input string, a mapping that maps the binary numbers into the respective states thereof, and (ii) instructing the circuitry to program M of the cells to represent the input string in accordance with the selected mapping.

One basic method of the present invention is a method of storing an input string of M N-tuples of bits. N is an integer greater than 1. In the examples below, the N-tuples are pairs (N=2). A substitution transformation is selected to apply to the input string. A "substitution transformation" is a substitution cipher in which the "alphabet" is the set of binary numbers from 0 through $2^N-1$. Hence, in the examples below, the substitution transformations are substitution ciphers in which the "alphabet" is the binary numbers 00, 01, 10 and 11. The substitution transformation is selected in accordance with the input string, so that different input strings could get different substitution transformations applied to them. The selected substitution transformation is applied to the input string, thereby providing a transformed string of M N-tuples of bits. M or more cells of a memory then are programmed to represent the transformed string. That the substitution transformation is selected in accordance with the input string distinguishes the present invention from prior art methods in which an input string is encrypted prior to being stored, because in those prior art methods the same encryption transformation is applied to all input strings. That the input string and the transformed string have the same number of bits distinguishes the substitution transformation of the present invention from prior art adaptive compression algorithms.

Preferably, the memory is operative to selectively program each of its cells to represent each binary number from 0 through $2^N-1$ as a respective one of $2^N$ states of the cell that are ordered from a lowest state to a highest state. The selected substitution transformation is such that the binary number that is represented as the lowest state is the N-tuple that occurs least often in the transformed string.

Alternatively, the memory is operative to selectively program each of its cells to represent each binary number from 0 through $2^N-1$ as a respective one of $2^N$ states of the cell. The selected substitution transformation is such that a first one of those binary numbers occurs at most as often as, or alternatively less often than, an N-tuple of the transformed string as does a second one of those binary numbers. For example, in some embodiments of the present invention it is required that 11 occur in the transformed string at most as often as, or alternatively less often than, 00.

Alternatively, the memory is operative to selectively program each of its cells to represent each binary number from 0 through $2^N-1$ as a respective one of $2^N$ states of the cell. The selected substitution transformation is such that those binary numbers occur as N-tuples of the transformed string with respective frequencies that are in a predetermined order, as in FIG. 6 below.

Alternatively, the memory is operative to selectively program each of its cells to represent each binary number from 0 through $2^N-1$ as a respective one of $2^N$ states of the cell. The selected substitution transformation is such that a designated one of those binary numbers occur as N-tuples of the transformed string with at most a predetermined frequency.

Preferably, a key, such as a single N-tuple of bits, or alternatively an ordered list of N-tuples of bits for effecting a substitution transformation, is stored in the memory in association with the M or more cells. Most preferably, if the key is a single N-tuple of bits, the selected substitution transformation is effected by arithmetically combining (e.g., adding, multiplying, inverting and adding, or inverting and multiplying) the key with each N-tuple of the input string.

Also most preferably, error correction encoding is applied to the key before storing the key in the memory, as in FIG. 3 below.

Alternatively and more preferably, the key is a key string of K N-tuples. The programming of the memory cells to represent the transformed string and the storing of the key in the memory are combined into the step of concatenating the transformed string and the key string to provide a concatenated string and the step of programming M+K memory cells to represent the concatenated string, as in FIG. 5 below. Most preferably, error correction encoding is applied to the concatenated string before the M+K cells are programmed to represent the concatenated string.

As an alternative or as a supplement to applying error correction encoding to the key, the key is stored in a reliable partition of the memory.

Preferably, the method also includes reading the M or more cells, thereby providing a read string of M N-tuples, and applying an inverse of the selected substitution transformation to the read string, thereby providing an output string of M N-tuples. If the invention has worked correctly, which is almost invariably the case, the output string is identical to the input string.

Preferably, the memory is operative to selectively program each of its cells to represent each binary number from 0 through $2^N-1$ as a respective one of $2^N$ states of the cell. The selecting is of a substitution transformation that results in the programming, of the M or more memory cells to represent the transformed string, yielding a distribution of respective states of the M or more cells that satisfies a predetermined logical condition. Examples of such logical conditions include the lowest state occurring least often in the distribution (in the case of the states being ordered from lowest to highest), a first state occurring at most as often in the distribution as a second state, a first state occurring in the distribution less often than a second state, a predetermined ordering of respective frequencies of all the states, and a designated one of the states occurring in the distribution with at most a predetermined frequency.

Another basic method of the present invention also is a method of storing an input string of M N-tuples of bits. As in the first basic method, N is an integer greater than 1. A memory is provided that is operative to selectively program each of at least M of its cells to a respective one of $2^N$ states of the cell. In accordance with the input string, a mapping is selected that maps each binary number from 0 through $2^N-1$ into a respective one of the states. The M cells are programmed to represent the input string in accordance with the selected mapping.

Preferably, the mapping is selected in accordance with a statistical property of the input string. Examples of mapping in accordance with a statistical property of the input string include the binary number that occurs least often as an N-tuple of the input string being mapped into the lowest state (in case the states are ordered from lowest to highest), first and second binary numbers being mapped into respective states with the first binary number occurring as an N-tuple of the input string at most as often as the second binary number, first and second binary numbers being mapped into respective states with the first binary number occurring as an N-tuple of the input string less often than the second binary number, each binary number being mapped into its respective state in accordance with a frequency with which that binary number occurs as a N-tuple of the input string, and a designated one of the binary numbers being mapped into its respective state in accordance with that binary number occurring as an N-tuple of the input string with at most a predetermined frequency.

Preferably, a key of the selected mapping, such as a single N-tuple of bits or a list of the binary numbers from 0 through $2^N-1$ ordered according to the map, is stored in the memory in association with the M bits. Most preferably, the key is stored in the memory in accordance with a default mapping. Alternatively, the key is stored in a reliable partition of the memory. Also most preferably, error correction encoding is applied to the key before the key is stored in the memory.

Preferably, the method also includes the step of reading the M cells in accordance with the selected mapping, thereby providing an output string of M N-tuples. As in the first method, if the invention has worked correctly, which is almost invariably the case, the output string is identical to the input string.

Preferably, the selected mapping is such that the programming of the M cells to represent the input string yields a distribution of respective states of the M cells that satisfies a predetermined logical condition. Examples of such logical conditions include the lowest state occurring least often in the distribution (in the case of the states being ordered from lowest to highest), a first state occurring at most as often in the distribution as a second state, a first state occurring in the distribution less often than a second state, a predetermined ordering of respective frequencies of all the states, and a designated one of the states occurring in the distribution with at most a predetermined frequency.

A memory of the present invention includes at least M nonvolatile memory cells and circuitry for storing an input string of M N-tuples of bits in the nonvolatile memory cells, with N being an integer greater than 1, using one of the methods of the present invention. Preferably, the circuitry is operative to selectively program each cell to represent each binary number from 0 through $2^N-1$ as a respective one of $2^N$ (most preferably ordered) states of the cell. Preferably, the memory also includes circuitry for reading the string as stored, using a corresponding preferred method of the present invention.

A memory device of the present invention includes a memory that has at least M nonvolatile memory cells, and a controller for storing an input string of M N-tuples of bits in the memory, with N being an integer greater than 1, using one of the methods of the present invention. A memory device that uses one of the second methods of the present invention also includes circuitry for selectively programming each memory cell to represent each binary number from 0 through $2^N-1$ as a respective one of $2^N$ preferably ordered) states of the cell. Memory devices that use some of the first methods of the present invention similarly are operative to selectively program their cells to represent the binary numbers from 0 through $2^N-1$ as respective ones of $2^N$ (most preferably ordered) states of the cells.

Preferably, the controller of a memory device that uses one of the first methods of the present invention also is operative to instruct the memory to read the stored string and to apply an inverse of the selected substitution transformation to the string as read in order to provide an output string of M N-tuples. Also preferably, a memory device that uses one of the second methods of the present invention also includes circuitry for reading the memory cells, and the device's controller is operative to instruct the reading circuitry to read the cells, wherein the input string is stored, in accordance with the selected mapping in order to provide an output string of M N-tuples.

A system of the present invention includes a first nonvolatile memory with at least M nonvolatile memory cells and a host of the first nonvolatile memory. The host includes a host memory, such as a RAM or a hard disk, for storing an input string of M N-tuples, where N is an integer greater than 1. The host also includes a second nonvolatile memory, such as a hard disk, for storing a driver for the first nonvolatile memory, and a processor for executing the driver code. The driver code includes code for implementing one of the first methods of the present invention. Hence, in executing the driver code, the host emulates the controller of the memory device of the present invention. For example, the host preferably is operative to selectively program the cells of the first nonvolatile memory to represent the binary numbers from 0 through $2^N-1$ as respective ones of $2^N$ (most preferably ordered) states of the cells. The scope of the present invention also includes a computer-readable storage medium having embedded thereon such driver code.

BRIEF DESCRIPTION OF THE DRAWINGS

The invention is herein described, by way of example only, with reference to the accompanying drawings, wherein.

DESCRIPTION OF THE PREFERRED EMBODIMENTS

The principles and operation of a flash memory according to the present invention may be better understood with reference to the drawings and the accompanying description.

The present invention reduces the effect of error sources such as PD that depend on the user data stored in a multi bit per cell flash memory device by manipulating the user data and controlling the actual sequence of states that is programmed into the flash memory.

According to the present invention, a desired distribution states, that is optimal in the sense of minimizing the expected number of cell errors, is induced over the flash memory cells. For example, in some embodiments of the present invention the expected number of cell errors is minimized by minimizing the number of cells that are programmed to the erase state and/or to high states. This is done in the following way: The distribution of the states that should be programmed into the flash memory is examined as a function of the bit sequence that is to be stored in the flash memory. Then the bit sequence is altered according to a transformation rule that is invertible and that can be concisely described, such that the new distribution of states based on the altered bit sequence is closer, and preferably as close as possible, to the optimal desired distribution. The altered bit sequence is stored into the flash memory. The transformation rule also is stored in the flash memory in order to allow recovery of the original bit sequence upon reading. Note that it is also possible to embed the transformation rule inside the altered bit sequence. When the flash memory is read, the stored bit sequence and the transformation rule are recovered. The transformation rule is then used in order to obtain the original bit sequence by performing an inverse transformation.

Note that it is desirable that the transformation rule that is stored in the flash memory be well protected, such that the transformation rule can be recovered without errors with very high probability. This can be done in several ways.

Figure 3:
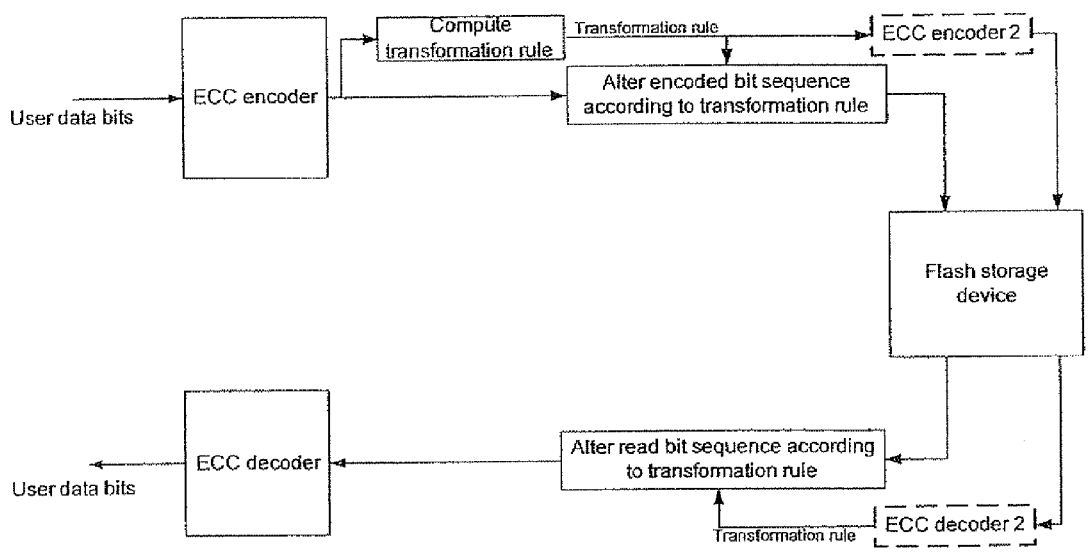
FIG. 3 illustrates an embodiment of the present invention in which a transformation rule is selected and applied subsequent to ECC encoding.

Returning now to the drawings, according to one embodiment of the present invention shown in FIG. 3, a transformation rule is chosen based on the ECC-encoded user data bits, such that applying the transformation to the bit sequence results in an altered bit sequence that when programmed to the flash memory induces a states distribution that is closer, and preferably as close as possible, to the desired states distribution. The encoded user data are altered based on the transformation rule and then are programmed into the flash memory. The transformation rule is separately protected by an ECC and then is programmed into the flash memory. Upon reading the flash memory, the transformation rule is recovered by an ECC decoder. The transformation rule then is used in order to recover the stored encoded user data bits together with bit errors introduced in the course of storing the encoded user data in the flash memory (referred to as "noisy" encoded user data bits). The user data bits are then recovered by ECC decoding of the noisy encoded user data bits. Note that it might be the case that an ECC is not required for protecting the transformation rule and/or the user data bits. For example if a small reliable partition requiring no ECC protection (such as an SBC flash partition) is allocated in the flash memory, then a transformation rule that can be concisely described using a small number of bits can be stored in the small reliable partition without ECC protection. Because ECC encoding and decoding is optional, the ECC encoder and decoder blocks for the transformation rule in FIG. 3 have dashed borders rather than solid borders.

The form in which the transformation rule is stored in the flash memory is referred to in the appended claims as a "key" of the transformation.

Figure 4:
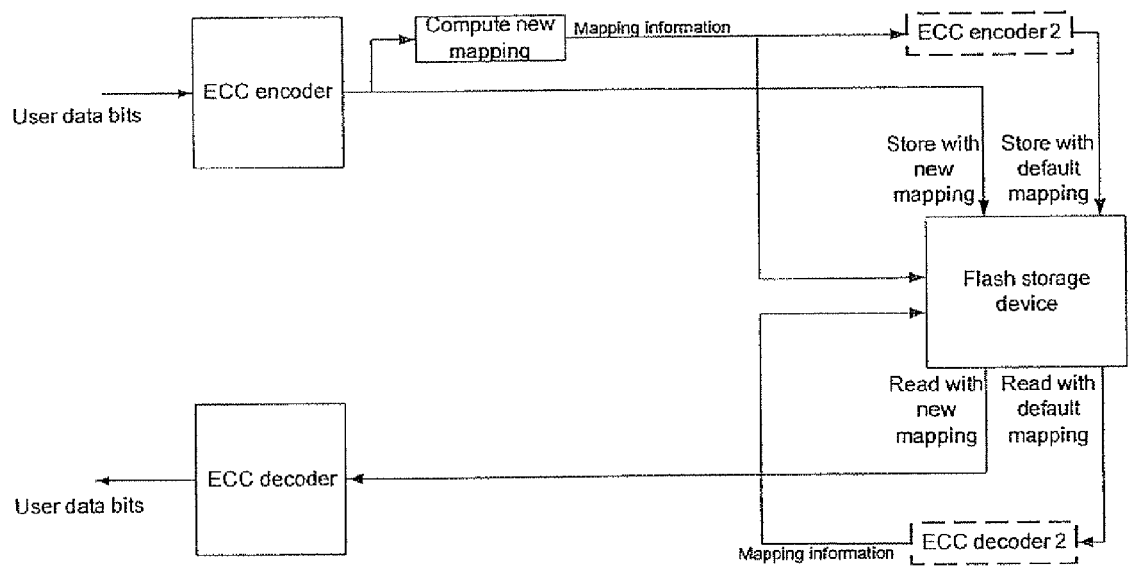
FIG. 4 illustrates an embodiment of the present invention in which a default mapping from bits to states is replaced with a substitute mapping.

According to another embodiment of the present invention shown in FIG. 4, an optimal mapping from bits to states is computed, such that the states distribution induced by the ECC encoded user data bits is closer, and preferably as close as possible, to the desired states distribution. The mapping information is protected by an ECC and then is programmed to the flash memory according to a default mapping from bits to states. The encoded user data bits are stored into the flash memory according to the new mapping. Upon reading the flash memory, the mapping information is recovered by an ECC decoder. The mapping information is used in order to read the stored encoded user data bits together with bit errors introduced by the flash (referred to as "noisy" encoded user data bits). The user data bits then are recovered by ECC decoding of the noisy encoded user data bits. Note that it might be the case that an ECC is not required for protecting the transformation rule and/or the user data bits. For example if a small reliable partition requiring no ECC protection (such as an SBC flash partition) is allocated in the flash memory, then the mapping information that can be concisely described using a small number of bits can be stored in the small reliable partition without ECC protection. Because ECC encoding and decoding is optional, the ECC encoder and decoder blocks for the mapping information in FIG. 3 have dashed borders rather than solid borders.

The form in which the mapping information is stored in the flash memory is referred to in the appended claims as a "key" of the mapping.

Figure 5:
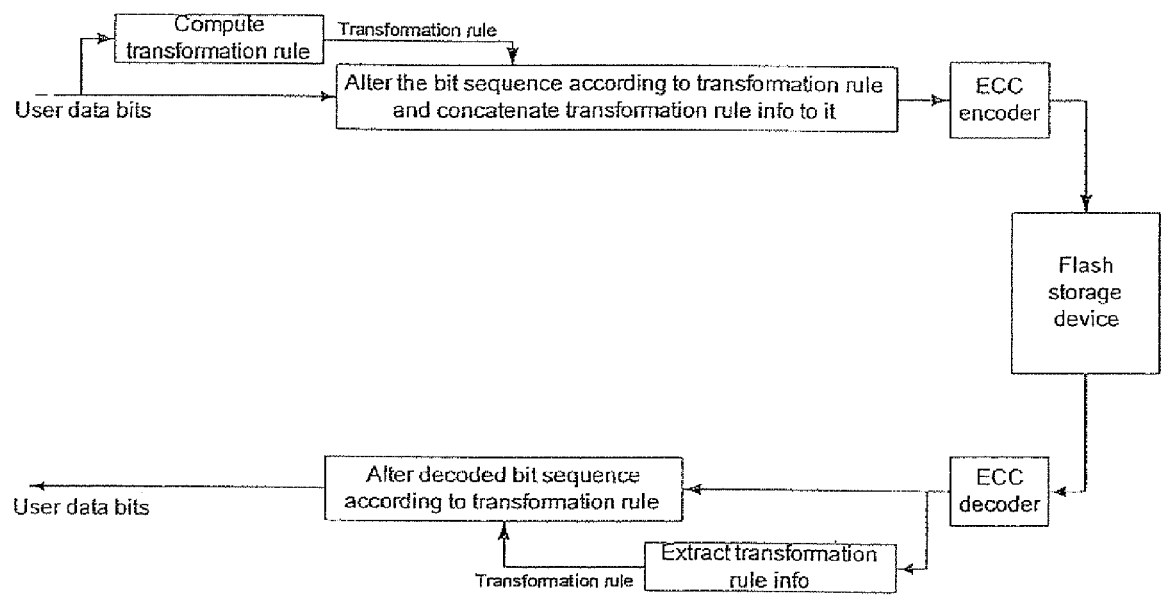
FIG. 5 illustrates an embodiment of the present invention in which a transformation rule is selected and applied prior to ECC encoding.

According to another embodiment of the present invention shown in FIG. 5, a transformation rule is chosen based on the user data bits. The user data bits are altered based on the transformation rule. The transformation rule, that can be concisely described using a small number of bits, is concatenated to the altered user data bits sequence. The resulting bit sequence is encoded using an ECC encoder. If the ECC encoder is systematic, it computes a set of parity bits that is concatenated to the bit sequence to produce a codeword. If the ECC encoder is not systematic, it produces a codeword in which the input bit sequence is not separately recognizable. The codeword is programmed to the flash memory. Note that the transformation rule is chosen in such a way that the induced states distribution of the encoded bit sequence is closer, and preferably as close as possible, to the desired states distribution. Upon reading the flash memory, the read bit sequence is decoded by an ECC decoder, recovering both the transformation rule and the altered user data bits. The transformation rule then is used for recovering the user data bits from the altered user data bits.

Next, we provide two very simplified detailed examples of embodiments of the present invention. We assume that the flash memory is a two-bit-per-cell MBC flash memory and that each cell can be programmed into L=4 states or voltage levels. We assume that one flash page is programmed in each programming operation and that each flash page stores 24 user data bits.

The first example is based on the embodiment shown in FIG. 5. We assume that the transformation rule is two bits long and so is stored in one cell. We assume that each page is encoded using a systematic ECC of rate R=(24+2)/28=0.9286. i.e., the ECC adds two redundant bits, for protecting the user data bits and the mapping information, that occupy 7% of the cells in the page. In this example, we define a good states distribution over the cells of the page as a distribution in which the fraction of cells in the page that are programmed to the erase state (state 0 mapped by 11) is smaller than 0.36. The present invention ensures that every programmed bit sequence induces a good states distribution, regardless of the user data that are stored in the flash memory, by implementing the following steps.

1) Compute the states distribution induced by the user data bits. For example, the following sequence of 24 user data bits:
   [1 1, 1 1, 1 1, 1 1, 1 1, 0 1, 0 0, 0 1, 1 0, 0 0, 0 1, 0 1]
   would induce the following states distribution over a flash page if it were programmed: state 0 (11)-5, state 1 (01)-4, state 2 (00)-2, state 3 (10)-1
2) Choose the state, from among the set of states, that appears least often in the states distribution. If there is more than one such state, the choice is arbitrary, e.g., random. The transformation rule is defined as summation modulo 2 of the user data bits with the inverse of the chosen state. In the example above, the controller chooses state 3 (10) and the transformation rule is defined as summation modulo 2 of the user data bits with $\overline{10}$=01.
3) Transform the user data bit sequence by summing the user data bit sequence modulo 2 with the inverse of the state chosen in step 2. In this example we sum the user data bit sequence with $\overline{10}$=01 and obtain the following transformed bit sequence:
   [1 0, 1 0, 1 0, 1 0, 1 0, 0 0, 0 1, 0 0, 1 1, 0 1, 0 0, 0 0].
4) Concatenate the transformation rule information, represented by the inverse of the state chosen in step 2, to the altered bit sequence. In this example we obtain the following bit sequence:
   [1 0, 1 0, 1 0, 1 0, 1 0, 0 0, 0 1, 0 0, 1 1, 0 1, 0 0, 0 0, 0 1]
   by concatenating "0 1" to the altered bit sequence.
5) Encode the altered bit sequence using the ECC encoder. In this example, the FCC encoder adds two redundant bits, so that one additional cell is needed in the page for storing the redundant bits. Assuming that the redundant bits are 11 (this is the worst case), we obtain the following encoded bit sequence:
   [1 0, 1 0, 1 0, 1 0, 1 0, 0 0, 0 1, 0 0, 1 1, 0 1, 0 0, 0 0, 0 1, 1 1]
6) Program the encoded bit sequence into the flash memory. In this example, the induced states distribution over the flash page is: state 0 (11)-2, state 1 (01)-3, state 2 (00)-4, state 3 (10)-5, so that the fraction of cells programmed to the erase state is 2/14=0.14.
7) Upon reading the flash memory, decode the read bit sequence. In this example the decoder decodes the read 28 bit sequence and outputs the stored 26 bits sequence
   [1 0, 1 0, 1 0, 1 0, 1 0, 0 0, 0 1, 0 0, 1 1, 0 1, 0 0, 0 0, 0 1].
8) Recover the transformation rule information from the decoded bits. In this example we recover the last two bits ("0 1") in the decoded bit sequence.
9) Recover the user data bits by applying the inverse transformation to the decoded bits. This is done by summing the decoded bits modulo 2 with the transformation rule bits recovered in the previous step. In this example, we recover the user data bits by performing:

[1 0, 1 0, 1 0, 1 0, 1 0, 0 0, 0 1, 0 0, 1 1, 0 1, 0 0, 0 0]+[0 1]=[1 1, 1 1, 1 1, 1 1, 1 1, 0 1, 0 0, 0 1, 1 0, 0 0, 0 1, 0 1].

This procedure ensures that the states distribution induced by the programmed bits sequence is such that the erase state appears a small number of times. More precisely, this procedure ensures that the number of cells in the page that is programmed to the erase state is less than or equal to $(1/L)*k+1+m$, where $k=24/2=12$ is the number of cells that store user data bits and $m=2/2=1$ is the number of cells that store redundant bits. In other words, it is ensured that the fraction of cells programmed to the erase state in any page is less than or equal to $((1/L)*k+1+m)/n=(1/L)*R+1-R+(1/n)*(1-1/L)$, where $n=k+m+1=14$ is the number of cells in the page and $R=(k+1)/n=0.9286$ is the ECC rate. Note that unlike this very simplified example in which n is small (n=14) and R is relatively low (R=0.9286), in real-life n is large (typically between $10^3$ and $10^5$) and R is close to 1. In the real-life case the fraction of cells programmed to the erase state in any page is bounded above by $(1/L)*R+1-R+(1/n)*(1-1/L) \approx 1/L=0.25$, independent of the user data stored in the page.

Figure 6:
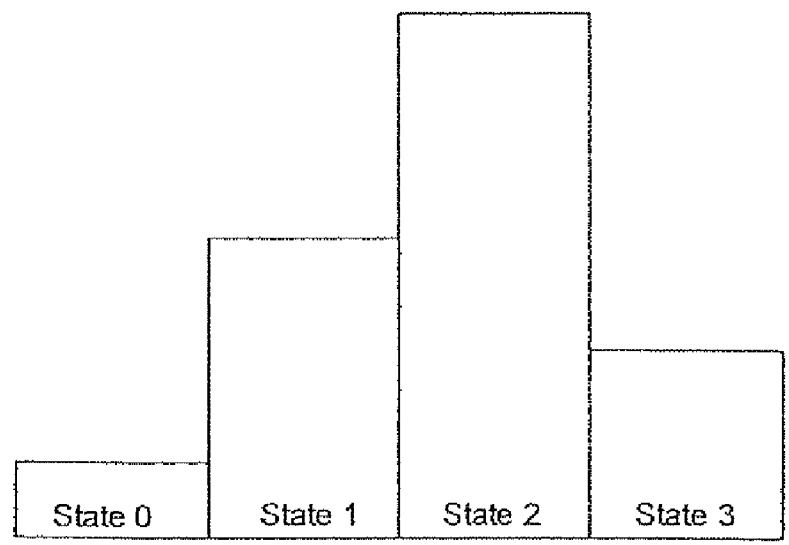
FIG. 6 is an exemplary histogram of a good states distribution.

In the second example we define a good states distribution as a distribution in which the erase state is as most as frequent as state 3, in which state 3 is at most as frequent as state 1, and in which state 1 is at most as frequent as state 2. The histogram of such a states distribution would look like the histogram shown in FIG. 6. It is possible to induce such good state distributions by changing the mapping from bits to states during flash programming, based on the embodiment shown in FIG. 4. However, in this example we assume that there is a fixed mapping from bits to states used by the flash device that cannot be changed. Hence, this example is based on the embodiment shown in FIG. 3. We assume that the following fixed mapping from bits to states is used: state 0-11, state 1-01, state 2-00, state 3-10. We further assume that the transformation rule information can be stored in a reliable partition of the flash and requires no ECC protection. A rate R=24/26=0.9231 ECC is required for protecting the user data bits. In this example, the present invention implements the following steps:

1) Encode the user data bits using the ECC encoder. For example, the user data bits sequence [1 1, 1 1, 1 1, 1 1, 1 1, 0 1, 0 0, 0 1, 1 0, 0 0, 0 1, 0 1] is encoded into the encoded sequence
[1 1, 1 1, 1 1, 1 1, 1 1, 0 1, 0 0, 0 1, 1 0, 0 0, 0 1, 0 1,] by appending the two parity bits "1 1".

2) Compute the states distribution induced by the encoded bits sequence. The encoded bit sequence in this example, if programmed, would induce the following states distribution over a flash memory page:
state 0 (1)-6, state 1 (01)-4, state 2 (00)-2, state 3 (10)-1.

3) Compute a transformation rule that induces a good states distribution according to the desired criterion. In this example the transformation rule that is used maps 2-bit sequences into 2-bit sequences as follows:
00→10, 01→01, 10→11, 11→00.

4) Transform the user encoded bit sequence according to the transformation rule. In this example we obtain the following transformed bit sequence:
[0 0, 0 0, 0 0, 0 0, 0 0, 0 1, 1 0, 0 1, 1 1, 1 0, 0 1, 0 1, 0 0].

5) Store the transformation rule in the reliable flash partition. In this example we store [10, 01, 11, 00] in the reliable partition.

6) Store the altered encoded bit sequence in the flash memory. In this example, the induced states distribution over the flash memory page is: state 0 (11)-1, state 1 (01)-4, state 2 (00)-6, state 3 (10)-2.

7) Upon reading the flash memory, recover the transformation rule information from the reliable flash partition. In this example, we recover the transformation rule [00, 01, 10, 11]→[10, 01, 11, 00].

8) Read the programmed flash memory page and recover the "noisy" encoded bit sequence based on the inverse transformation. In this example, assuming no errors were introduced by storing the bit sequence in the flash memory, we read the bit sequence:
[0 0, 0 0, 0 0, 0 0, 0 0, 0 1, 1 0, 0 1, 1 1, 1 0, 0 1, 0 1, 0 0] and transform the bit sequence based on the inverse transformation to the bit sequence: [1 1, 1 1, 1 1, 1 1, 1 1, 0 1, 0 0, 0 1, 1 0, 0 0, 0 1, 0 1, 1 1].

9) Decode the "noisy" encoded bit sequence using the ECC decoder and recover the stored user data bits. In this example we recover the bit sequence:
[1 1, 1 1, 1 1, 1 1, 1 1, 0 1, 0 0, 0 1, 1 0, 0 0, 0 1, 0 1]

Note that in this example the transformation rule basically represents an alternative mapping from bits to states. We need $L*\log_2(L)$ bits in order to store the transformation rule. Actually $\log_2(L!)<L*\log_2(L)$ bits are sufficient for representing any mapping but then the mapping representation is "compressed" and less convenient to handle. In any case, when the number of cells in the page is large, the overhead of storing the transformation rule is negligible.

Figure 1:
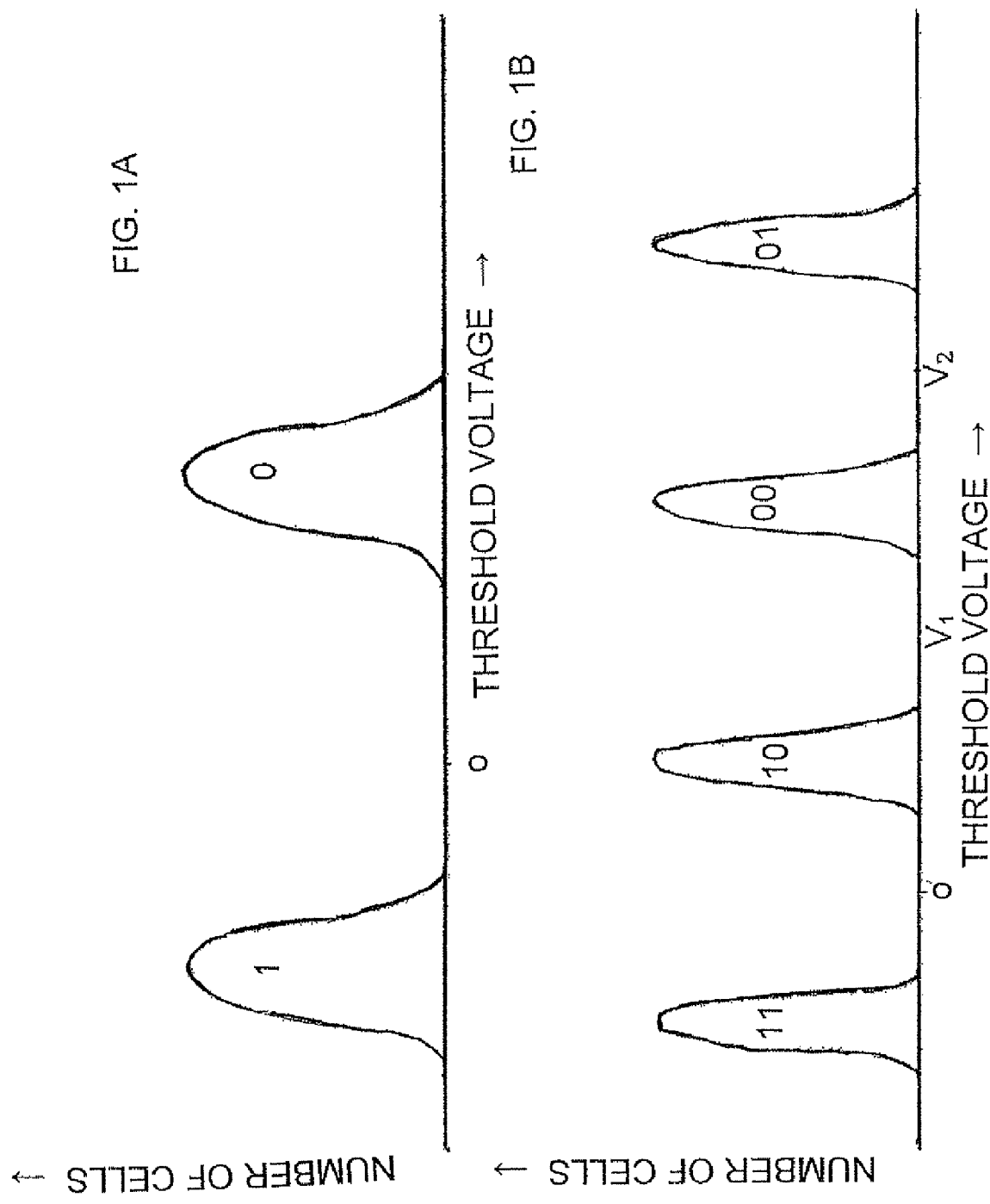
FIG. 1A illustrates the threshold voltage distributions of flash cells programmed in 1-bit mode.
FIG. 1B illustrates the threshold voltage distributions of flash cells programmed in 2-bit mode.

It should be noted that the above method of applying a transformation to the data bits assumes that the flash memory is being programmed. When a flash page is erased all of the cells of the page are set to the left-most state or voltage level (as illustrated in FIGS. 1A and 1B) and all the cells are assumed to contain the fixed all-1's data pattern. This might cause a confusion with a page that was actually programmed to the all-1's bit sequence, but that, according to the present invention, represents some other data bit sequence. However, this can be handled by the application using the flash memory device being able to distinguish a page that was not written yet from a page that was written. This is easy to do and is well known in the prior art of flash management systems, for example by allocating one or more flag cells, in the management portion of a page, that are always written as part of the page programming operation, and thus if found to be in the leftmost state, indicate an unwritten page. So a page found to be unwritten is interpreted according to the standard prior art logic, while a page found to be written is interpreted according to the methods of the present invention.

Methods for coping with user data dependent error sources such as PD errors in flash memory are already known in the prior art. U.S. patent application Ser. No. 11/797,379, filed May 3, 2007, describes a method for dealing with PD errors by changing the flash mapping in such a way that the all 1's bit sequence, which tends to frequently appear in user data in certain real-life scenarios, is not mapped to the erase state which is more vulnerable to PD errors. The disadvantage of this method is that because the mapping is fixed there are user data patterns that are mapped to programming state sequences with many cells programmed to the erase state. U.S. patent application Ser. No. 11/808,906, filed Jun. 13, 2007, describes a method for dealing with user-data-dependent errors such as PD errors by randomizing the bit sequences written to a flash memory. Like the method of U.S. Ser. No. 11/797,379, this method also does not depend on the actual user data and therefore has the disadvantage that even though this method provides a high probability of a "good"

distribution, there are user data patterns that when stored into the flash memory cause many cells to be programmed to the erase state, resulting in many PD errors. As opposed to these prior art methods, the present invention can ensure a "good" distribution of states over the flash cells for any user data pattern stored in the flash memory. For example, the present invention can ensure that for any user data pattern the fraction of cells that are programmed into the erase state is smaller than some threshold. Hence, under the present invention there are no problematic user data patterns that exhibit higher error rates than other user data patterns when stored in the flash memory.

Methods of inducing arbitrary distributions of states over the flash cells are known in the prior art. These methods, described in U.S. patent application Ser. No. 11/540,560, filed Oct. 2, 2006, are based on using a fixed non-bijective mapping (i.e. a mapping that is either not one-to-one or not onto) from bit sequences to voltage levels. However, this prior art method is based on a fixed mapping which is independent of the user data. As a result, this prior art method cannot ensure that every user data pattern induces a "good" distribution of states over the flash cells.

Note that the idea of a translation stage in which logical bit values that are to be stored in a storage device are translated into physical values that are the ones actually stored also is described prior art other than the prior art cited above. This idea is taught in US Patent Application Publication No. 2005/0213393 to Lasser. However, the translation of Lasser is done for a completely different purpose than the purpose of the present invention, and in any case is independent of the user data that are stored in the flash memory.

Gonzalez et al., in U.S. Pat. No. 6,684,289, also teach mapping between logical bit values and physical bit values when writing and reading a flash memory, for the purpose of avoiding repeated programming of static patterns of data (see column 6 lines 28-47). Not only do Gonzalez et al. '289 have nothing to do with minimizing the probability of data dependent errors such as PD errors of the stored bits, but Gonzalez et al. '289 also apply a time-varying transformation such that the same logical data value is transformed to different physical states at different times, as otherwise the goal of avoiding repeated programming of static data patterns is not achieved. The present invention, on the other hand, has no requirement that the transformation be time-dependent. The present invention applies a transformation that is a function of the user data but that need not have changed over time when the same data are stored again.

It should also be noted that while the above explanations of the operation of flash memory cells assumes that a cell storing N bits has exactly $2^N$ possible different states (represented by different ranges of its threshold voltage) and that an erase operation brings the cell to the leftmost (lowest voltage) state which also represents one of the $2^N$ data values, there are flash memory devices in which this is not the case. In such devices the erased state is different from all data states. Specifically, the erased state has a more negative threshold voltage than any of the data states. In such devices whenever writing data into the cell, even if the data are the all-ones value, the cell is programmed (that is—its threshold voltage is increased) to reach the state corresponding to the data value. In other words, the erased state is different than the all-ones state, unlike the devices previously referred to. Even though the above explanations of the present invention were given in the context of the first type of devices, the invention is also equally applicable to the second type of devices.

The methods of the present invention can be implemented either by software or by hardware. More specifically, the transformation of the bits (during writing, reading or both) can be implemented by executing software code or by electrical circuitry (such as inverter gates). If the transformation is implemented by software, it may be implemented either by software executed on the host computer that writes or reads the data (for example, within the software device driver supporting the storage device), or it may be implemented by firmware executed within the memory controller (e.g., controller 20 of FIG. 2) that interacts with the host computer and controls the memory media. If the transformation is implemented by hardware, it may be implemented either in the memory controller or within the memory media (e.g. in data input/output circuit 6 of FIG. 2). This applies whether the memory controller and the memory media are two separate dies or reside on a common die. All the above configurations and variations are within the scope of the present invention.

Figure 2:
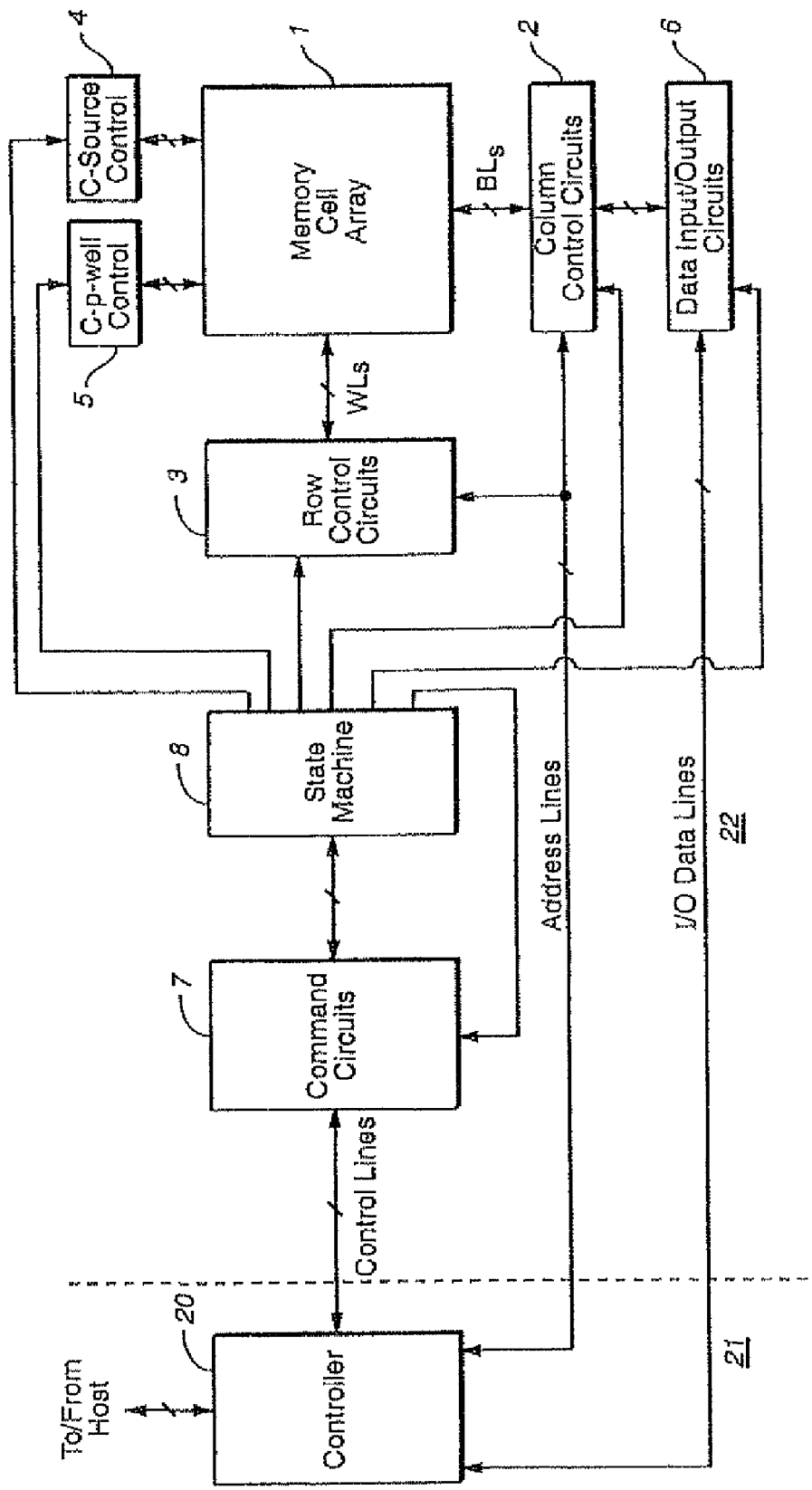
FIG. 2 is a block diagram of a flash memory device.

Thus, in addition to illustrating a typical prior art flash memory device, FIG. 2 also illustrates two kinds of embodiments of a flash memory device of the present invention in which the methods of the present invention are implemented by the circuitry of circuit chip(s) 22. In principle, the circuitry could perform ECC encoding and decoding. In practice, this usually is prohibitively expensive. Therefore, part of memory cell array 1 is reserved for programming in SBC mode, for storing the key of the transformation (method of FIG. 3) or of the mapping (method of FIG. 4). In the first kind of embodiment, upon receiving an input string to store in memory cell array 1, command circuits 7 select the substitution transformation to apply to the input string and then apply the selected transformation to the input string prior to transferring the input string and the transformation key to state machine 8 for programming into memory cell array 1 as described above and as illustrated in FIG. 3. When command circuits 7 receive an instruction from controller 20 to read the string, command circuits 7 read both the string and the transformation key and apply the inverse transformation to the string before sending the string to controller 20. In the second kind of embodiment, upon receiving an input string to store in memory cell array 1, command circuits 7 select, in accordance with the input string, a map of the binary integers in the interval $[0,2^N-1]$ to the $2^N$ states to which column control circuit 2 and row control circuit 3 program the cells of memory cell array 1 other than the cells of the SBC partition. State machine 8 then directs column control circuit 2 and row control circuit 3 to program the input string into memory cell array 1 in accordance with the selected map and to program a key of the map into the SBC partition of memory cell array 1, as described above and as illustrated in FIG. 4. When command circuits 7 receive an instruction from controller 20 to read the string, command circuits 7 read the map key from the SBC partition of memory cell array 1 and instruct state machine 8 to direct column control circuit 2 and row control circuit 3 to read the string in accordance with the map.

Similarly, FIG. 2 illustrates corresponding embodiments of a flash memory device of the present invention in which the methods of the present invention, as illustrated in FIGS. 3-5, are implemented by controller 20, either in dedicated hardware, or by executing flash controller software, or by a combination of the two. For implementing the embodiment of FIG. 4, command circuits 7 are provided with a default map of the binary integers in the interval $[0, 2^N-1]$ to the $2^N$ states to which column control circuit 2 and row control circuit 3 program the cells of memory cell array 1 (other than cells of a SBC partition in embodiments in which memory cell array 1 has such a partition). Typically, the default map maps binary $2^N-1$ (a string of N 1's) to the lowest programmed state of the cells. Command circuits 7 also are operative to temporarily replace the default map with a replacement map as commanded by controller 20 in support of the method of FIG. 4.

Figure 7:
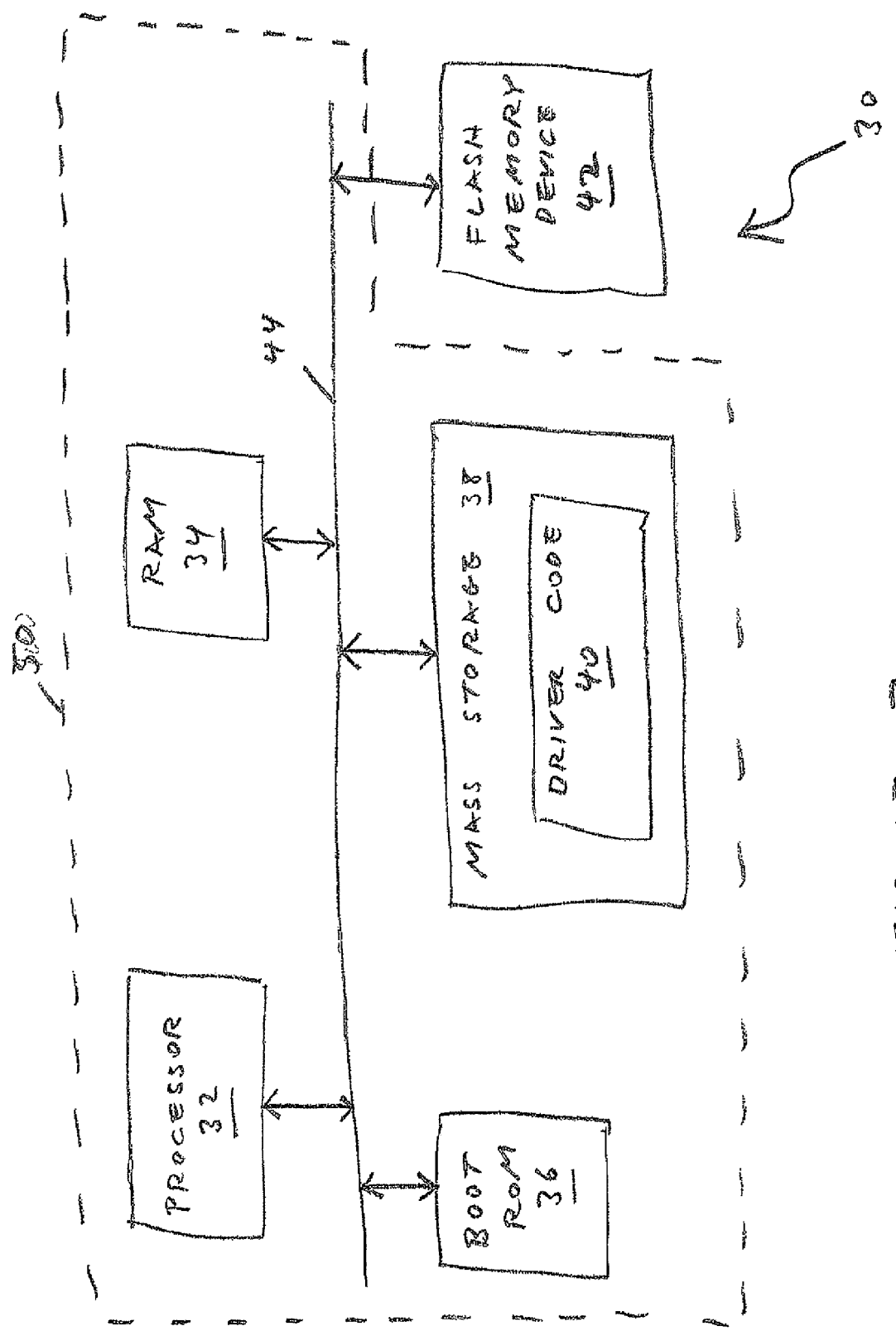
FIG. 7 is a high-level block diagram of a system of the present invention.

FIG. 7 is a high-level block diagram of a system 30 of the present invention. System 30 includes a processor 32 and four memory devices: a RAM 34, a boot ROM 36, a mass storage device (hard disk) 38 and one or more circuit chips 22 of FIG. 2 as a flash memory device 42, all communicating via a common bus 44. Flash memory driver code 40 is stored in mass storage device 38 and is executed by processor 32 to interface between user applications executed by processor 32 and flash memory device 42, and to manage the flash memory of flash memory device 42. In addition to the conventional functionality of such flash management driver code, driver code 40 emulates the functionality of controller 20 of FIG. 2 with respect to implementing the methods of the present invention. Driver code 40 typically is included in operating system code for system 30 but also could be freestanding code.

The components of system 30 other than flash memory device 42 constitute a host 50 of flash memory device 42. Mass storage device 38 is an example of a computer-readable storage medium bearing computer-readable driver code for implementing the present invention. Other examples of such computer-readable storage media include read-only memories such as CDs bearing such code.

While the invention has been described with respect to a limited number of embodiments, it will be appreciated that many variations, modifications and other applications of the invention may be made.

What is claimed is:

1. A method of storing an input string of M N-tuples of bits, wherein N>1, the method comprising the steps of:
    (a) selecting, in accordance with the input string, a substitution transformation to apply to the input string;
    (b) applying said selected substitution transformation to the input string, thereby providing a transformed string of MN-tuples of bits; and
    (c) programming M cells of a memory to represent said transformed string;
    wherein said memory is operative to selectively program each said cell to represent each binary number from 0 through $2^N-1$ as a respective one of $2^N$ ordered states of said each cell, and wherein said selecting is of a said substitution transformation that results in said programming yielding a distribution of respective said ordered states of said cells that satisfies a predetermined logical condition selected from the group consisting of a said ordered state other than a lowest said ordered state occurring most often in said distribution and said lowest ordered state occurring in said distribution with at most a predetermined frequency.

2. The method of claim 1, wherein said lowest ordered state occurs least often in said distribution.

3. The method of claim 1, further comprising the step of:
    (d) storing a key of said selected subsitution transformation in said memory in association with said cells.

4. The method of claim 3, wherein said key is a single N-tuple of bit

5. The method of claim 4, wherein said selected substitution transformation is effected by arithmetically combing said key with each said N-tuple of said input string.

6. The method of claim 3, wherein said key is an ordered list of N-tuples of bits for effecting a substitution transformation.

7. The method of claim 3, further comprising the step of:
    (e) applying error correction encoding to said key before said storing of said key in said memory.

8. The method of claim 3, wherein said key is a key string of K N-tuples, and wherein said programming and said storing of said key is effected by steps including:
    concatenating said transformed string and said key string, thereby providing a concatenated string; and
    (ii) programming M+K cells of said memory to represent said concatenated string.

9. The method of claim 8, wherein said storing of said key is effected by steps further including:
    (iii) applying error correction encoding to said concatenated string before programming said M+K cells of said memory to represent said concatenated string.

10. The method of claim 3, wherein said key is stored in a reliable partition of said memory.

11. The method of claim 1, further comprising the steps of:
    (d) reading said cells, thereby providing a read string of MN-tuples; and
    (e) applying an inverse of said selected substitution transformation to said read string, thereby providing an output string of MN-tuples.

12. A memory comprising:
    (a) M nonvolatile memory cells; and
    (b) circuitry for storing an input string of M N-tuples of bits in said nonvolatile memory cells, wherein N>1, by steps including:
        (i) selecting, in accordance with said input string, a substitution transformation to apply to said input string,
        (ii) applying said selected substitution transformation to said input string, thereby providing a transformed string of M N-tuples of bits, and
        (iii) programming said cells to represent said transformed string;
    wherein said circuitry is operative to selectively program each said cell to represent each binary number from 0 through $2^N-1$ as a respective one of $2^N$ ordered states of said each cell, and wherein said selecting is of a said substitution transformation that results in said programming yielding a distribution of respective said ordered states of said cells that satisfies a predetermined logical condition selected from the group consisting of a said ordered state other than a lowest said ordered state occurring most often in said distribution and said lowest ordered state occurring in said distribution with at most a predetermined frequency.

13. The memory of claim 12, wherein said circuitry stores said input string in said nonvolatile memory cells by steps further including:
    (iv) programming at least one of said cells to represent a key of said selected substitution transformation.

14. The memory of claim 12, further comprising:
    (c) circuitry for:
        (1) reading said cells, thereby providing a read string of M N- tuples; and
        (ii) applying an inverse of said selected substitution transformation to said read string, thereby providing an output string of M N- tuples.

15. A memory device comprising:
    (a) a memory including M nonvolatile memory cells; and
    (b) a controller for storing an input string of M N-tuples of bits in said memory, wherein N>1, by steps including:
        (i) selecting, in accordance with said input string, a substitution transformation to apply to said input string,
        (ii) applying said selected substitution transformation to said input string, thereby providing a transformed string of M N-tuples of bits, and (iii) instructing said memory to program said cells to represent said transformed string;
wherein said memory is operative to selectively program each said cell to represent each binary number from 0 through $2^N-1$ as a respective one of $2^N$ ordered states of said each cell, and wherein said selecting is of a said substitution transformation that results in said programming yielding a distribution of respective said ordered states of said cells that satisfies a predetermined logical condition selected from the group consisting of a said ordered state other than a lowest said ordered state occurring most often in said distribution and said lowest ordered state occurring in said distribution with at most a predetermined frequency.

16. The memory device of claim 15, wherein said controller stores said input string in said memory by steps further including:
(iv) instructing said memory to program at least one of said cells to represent a key of said selected substitution transformation.

17. The memory device of claim 15, wherein said controller is further operative:
(iv) to instruct said memory to read said cells, thereby providing a read string of M N-tuples; and
(v) to apply an inverse of said selected substitution transformation to said read string, thereby providing an output string of M N-tuples.

18. A system comprising:
(a) a first nonvolatile memory that includes M nonvolatile memory cells; and
(b) a host, of said first nonvolatile memory, that includes:
a host memory for storing an input string of M N-tuples of bits, wherein N>1,
(ii) a second nonvolatile memory for storing a driver for said first nonvolatile memory, said driver including code for:
(A) selecting, in accordance with said input string, a substitution transformation to apply to said input string, and
(B) applying said selected substitution transformation to said input string, thereby providing a transformed string of M N-tuples to be stored in said first nonvolatile memory by programming said cells to represent said transformed string, and
(C) storing said transformed string in said first nonvolatile memory, and
(iii) a processor for executing said code of said drive;
wherein said first nonvolatile memory is operative to selectively program each said cell to represent each binary number from 0 through $2^N-1$ as a respective one of $2^N$ ordered states of said each cell, and wherein said selecting is of a said substitution transformation that results in said programming yielding a distribution of respective said ordered states of said cells that satisfies a predetermined logical condition selected from the group consisting of a said ordered state other than a lowest said ordered state occurring most often in said distribution and said lowest ordered state occurring in said distribution with at most a predetermined frequency.

19. A computer-readable storage medium having computer-readable code embedded thereon, the computer-readable code being driver code for a memory device that includes M memory cells, the computer-readable code comprising:
(a) program code for selecting, in accordance with an input string of M N- tuples of bits, wherein N>1, a substitution transformation to apply to said input string; and
(b) program code for applying said selected transformation to said input string, thereby providing a transformed string of M N-tuples to be stored in the memory device by programming the memory cells to represent said transformed string;
wherein said memory device is operative to selectively program each said cell to represent each binary number from 0 through $2^N-1$ as a respective one of $2^N$ ordered states of said each cell, and wherein said selecting is of a said substitution transformation that results in said programming yielding a distribution of respective said ordered states of said cells that satisfies a predetermined logical condition selected from the group consisting of a said ordered state other than a lowest said ordered state occurring most often in said distribution and said lowest ordered state occurring in said distribution with at most a predetermined frequency.

20. A method of storing an input string of M N- tuples of bits, wherein N>1, the method comprising the steps of:
(a) providing a memory that is operative to selectively program each of M cells to a respective one of $2^N$ states of said each cell;
(b) selecting, in accordance with the input string, a mapping that maps each binary number from 0 through $2^N-1$ into a respective one of said states; and
(c) programming said cells to represent the input string in accordance with said selected mapping;
wherein said selected mapping is such that said programming yields a distribution of said respective ordered states of said cells that satisfies a predetermined logical condition selected from the group consisting of a said ordered state other than a lowest said ordered state occurring most often in said distribution and said lowest ordered state occurring in said distribution with at most a predetermined frequency.

21. The method of claim 20, wherein said lowest ordered state occurs least often in said distribution.

22. The method of claim 20, further comprising the step of:
(d) storing a key of said selected mapping in said memory in association with said cells.

23. The method of claim 22, wherein said key is a single N-tuple of bits.

24. The method of claim 22, wherein said key is a list of said binary numbers from 0 through $2^N-1$, ordered according to said selected mapping.

25. The method of claim 22, wherein said key is stored in said memory in accordance with a default mapping.

26. The method of claim 22, wherein said key is stored in a reliable partition of said memory.

27. The method of claim 22, further comprising the step of:
(e) applying error correction encoding to said key before said storing of said key in said memory.

28. The method of claim 20, further comprising the step of:
(d) reading said cells in accordance with said selected mapping, thereby providing an output string of M N-tuples.

29. A memory comprising:
(a) M nonvolatile memory cells; and
(b) circuitry for storing an input string of M N-tuples of bits in said nonvolatile cells, wherein N>1, by steps including:
(i) selectively programming each said cell to represent each binary number from 0 through $2^N-1$ as a respective one of $2^N$ states of said each cell,
(ii) selecting, in accordance with the input string, a mapping that maps said binary numbers into said respective states thereof, and (iii) programming said cells to represent said input string in accordance with said selected mapping.

30. The memory of claim 29, wherein said circuitry stores said input string in said nonvolatile memory cells by steps further including:
 (iv) programming at least one of said cells to represent a key of said selected mapping.

31. The memory of claim 29, further comprising:
 (c) circuitry for reading said cells in accordance with said selected mapping, thereby providing an output string of M N-tuples 32. A memory device comprising:
 (a) a memory including:
  (i) M nonvolatile memory cells, and
  (ii) circuitry for selectively programming each said cell to represent each binary number from 0 through $2^N-1$ as a respective one of $2^N$ states of said each cell, and
 (b) a controller for storing an input string of M N-tuples of bits in said memory, wherein N>1, by steps including:
  (i) selecting, in accordance with the input string, a mapping that maps said binary numbers into said respective states thereof, and
  (ii) instructing said circuitry to program said cells to represent said input string in accordance with said selected mapping.

33. The memory device of claim 32, wherein said controller stores said input string in said memory by steps further including:
 (iii) instructing said circuitry to program at least one of said cells to represent a key of said selected mapping.

34. The memory device of claim 32, wherein said memory also includes:
 (iii) circuitry for reading said cells, said controller being further operative to instruct said circuitry for reading said cells to read said cells in accordance with said selected mapping, thereby providing an output string of M N-tuples.

\* \* \* \* \*

UNITED STATES PATENT AND TRADEMARK OFFICE
CERTIFICATE OF CORRECTION

| | | |
|---|---|---|
| PATENT NO. | : 7,984,360 B2 | |
| APPLICATION NO. | : 11/876789 | |
| DATED | : July 19, 2011 | |
| INVENTOR(S) | : Eran Sharon et al. | |

It is certified that error appears in the above-identified patent and that said Letters Patent is hereby corrected as shown below:

Column 20

Claim 8, line 4 should be corrected as follows:
Change:
"concatenating...."
To:
"(i) concatenating...."

Column 21

Claim 18, line 33 should be corrected as follows:
Change:
"a host...."
To:
"(i) a host...."

Column 23

Claim 29, line 2 should be corrected as follows:
Add:
"wherein said selected mapping is such that said programming yields a distribution of said respective ordered states of said cells that satisfies a predetermined logical condition selected from the group consisting of a said ordered state other than a lowest said ordered state occurring most often in said distribution and said lowest ordered state occurring in said distribution with at most a predetermined frequency."

After:
"....mapping."

Signed and Sealed this
Thirteenth Day of September, 2011

David J. Kappos
*Director of the United States Patent and Trademark Office*

CERTIFICATE OF CORRECTION (continued)
U.S. Pat. No. 7,984,360 B2

Column 24

Claim 32, line 6 should be corrected as follows:
Add:
"wherein said selected mapping is such that said programming yields a distribution of said respective ordered states of said cells that satisfies a predetermined logical condition selected from the group consisting of a said ordered state other than a lowest said ordered state occurring most often in said distribution and said lowest ordered state occurring in said distribution with at most a predetermined frequency."

After:
"....mapping."